(12) United States Patent
Simsek-Ege et al.

(10) Patent No.: US 11,557,592 B2
(45) Date of Patent: Jan. 17, 2023

(54) GATE NOBLE METAL NANOPARTICLES

(71) Applicant: Micron Technology, Inc., Boise, ID (US)

(72) Inventors: Fatma Arzum Simsek-Ege, Boise, ID (US); Kamal M. Karda, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 17/065,711

(22) Filed: Oct. 8, 2020

(65) Prior Publication Data

US 2021/0035979 A1 Feb. 4, 2021

Related U.S. Application Data

(62) Division of application No. 16/291,597, filed on Mar. 4, 2019, now Pat. No. 10,818,666.

(51) Int. Cl.
*H01L 27/108* (2006.01)
*H01L 21/285* (2006.01)
*H01L 21/28* (2006.01)

(52) U.S. Cl.
CPC .. *H01L 27/10823* (2013.01); *H01L 21/28044* (2013.01); *H01L 21/28088* (2013.01); *H01L 21/28568* (2013.01); *H01L 27/10876* (2013.01)

(58) Field of Classification Search
None
See application file for complete search history.

(56) References Cited

U.S. PATENT DOCUMENTS

| | | |
|---|---|---|
| 8,530,305 B2 | 9/2013 | Goswami |
| 9,768,181 B2 | 9/2017 | Chavan et al. |
| 2002/0081790 A1 | 6/2002 | Honigschmid et al. |
| 2003/0222279 A1 | 12/2003 | Jacob et al. |
| 2004/0082171 A1 | 4/2004 | Shin et al. |
| 2008/0218936 A1 | 9/2008 | Won et al. |
| 2009/0028745 A1 | 1/2009 | Gatineau et al. |
| 2011/0183507 A1 | 7/2011 | Figura et al. |

OTHER PUBLICATIONS

Ramaswamy, et al., "Metal Gate recessed Access Device (RAD) for DRAM Scaling", IEEE Workshop on Microelectronics and Electron Devices, Apr. 20, 2007, pp. 42-44. Boise, Idaho.
Shimojo, et al. "High-Density and High-Speed 128Mb Chain FeRAM with SDRAM-Compatible DDR2 Interface", Symposium on VLSI Technology Digest of Technical Papers, 2009, pp. 218-219.
Grumbine, et al., Base-Free Silylene Complexes Without fa-Donar Stabilization . . . J. Am Chem. Soc. (1994), vol. 116, No. 12, pp. 5495-5496.

*Primary Examiner* — Long Pham
(74) *Attorney, Agent, or Firm* — Brooks, Cameron & Huebsch, PLLC

(57) ABSTRACT

An example apparatus includes a first source/drain region and a second source/drain region formed in a substrate. The first source/drain region and the second source/drain region are separated by a channel. The apparatus includes a gate opposing the channel. The gate includes noble metal nanoparticles. A sense line is coupled to the first source/drain region and a storage node is coupled to the second source/drain region.

12 Claims, 8 Drawing Sheets

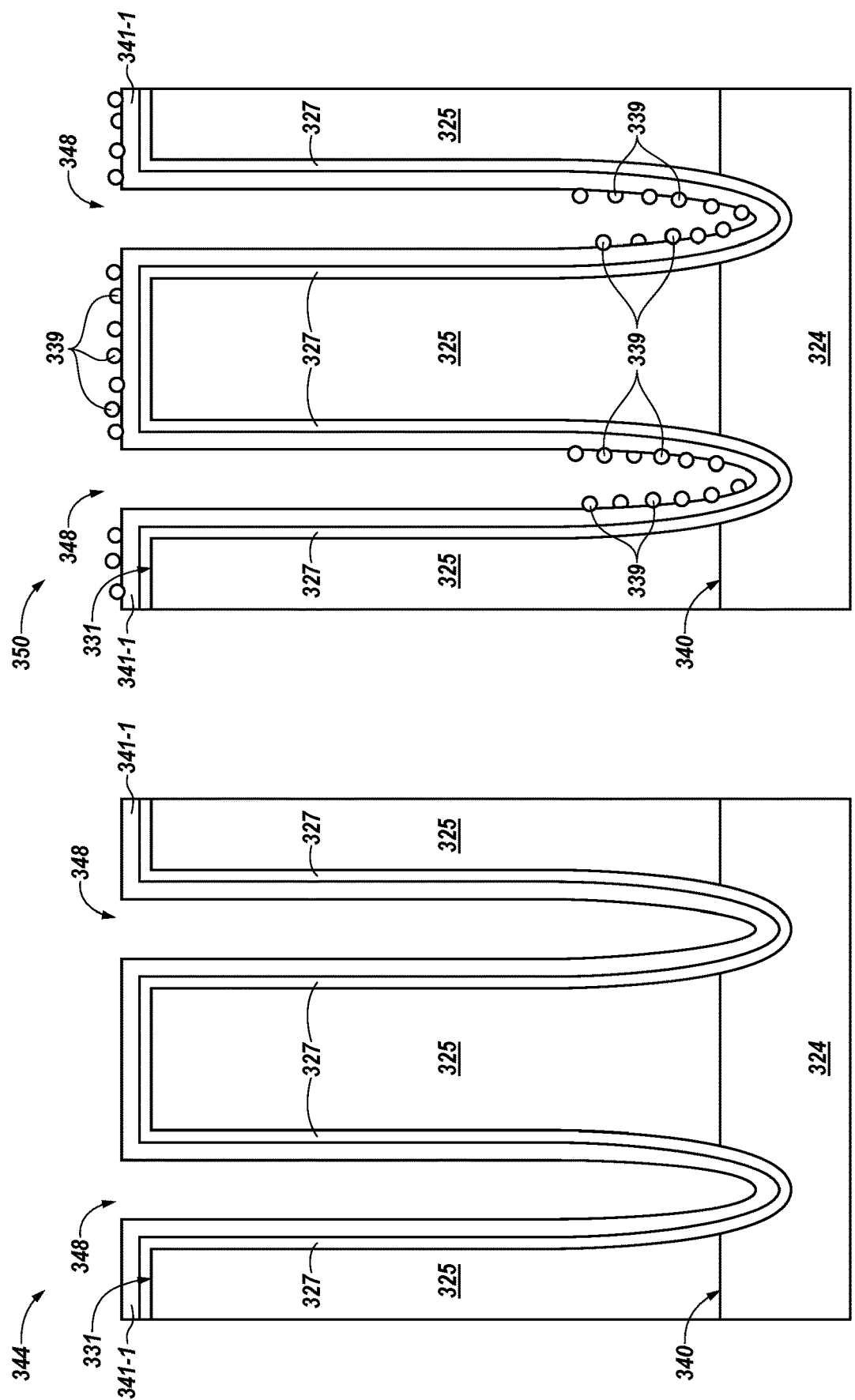

GATE NOBLE METAL NANOPARTICLES

PRIORITY INFORMATION

This application is a Divisional of U.S. application Ser. No. 16/291,597, filed Mar. 4, 2019, the contents of which are incorporated herein by reference.

TECHNICAL FIELD

The present disclosure relates generally to semiconductor devices and methods, and more particularly to gate noble metal nanoparticles.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 3A-3D illustrate cross-sectional views of transistors having gate noble metal nanoparticles at particular points in an example semiconductor fabrication process in accordance with a number of embodiments of the present disclosure.

DETAILED DESCRIPTION

Figure 1:
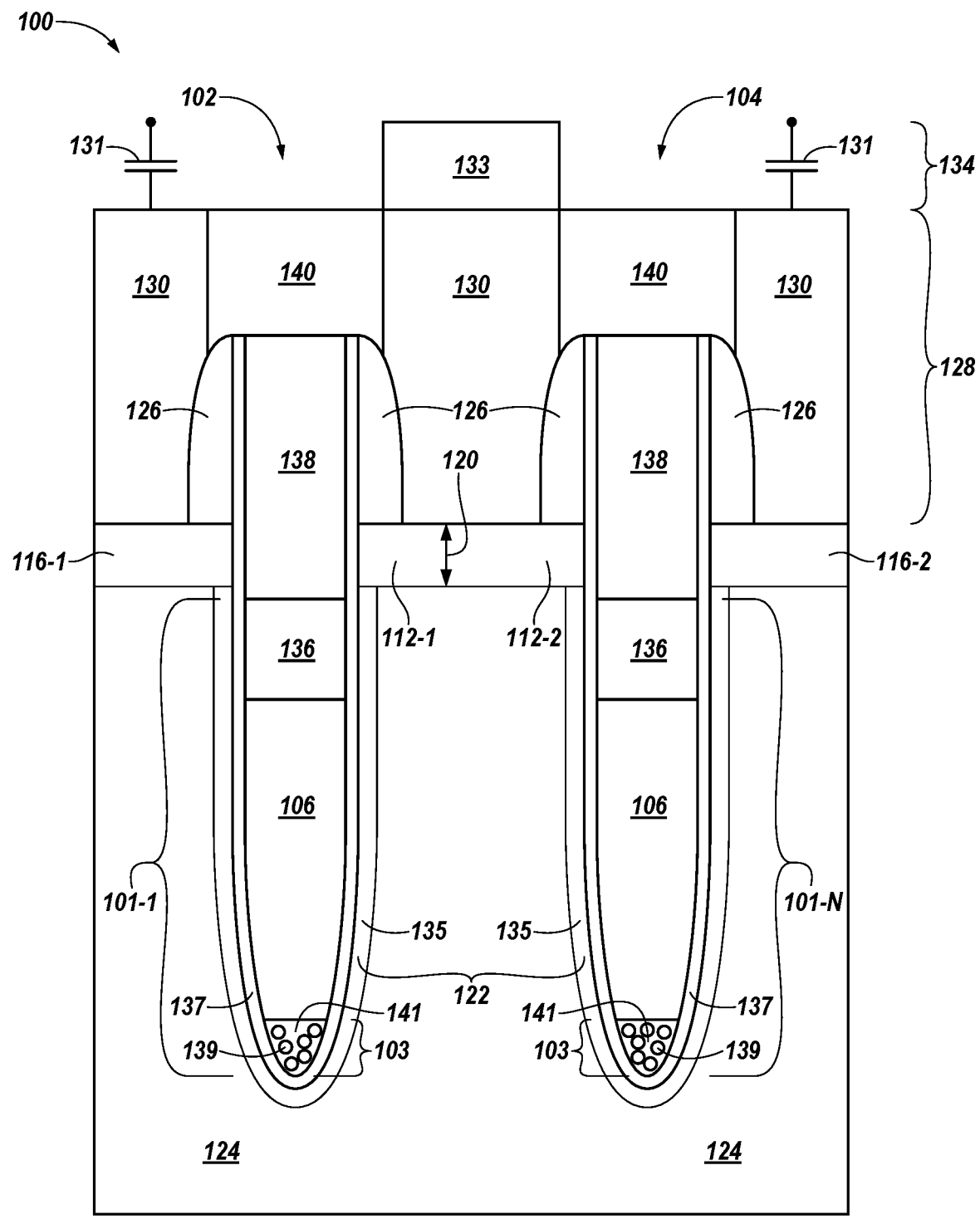
FIGS. 1-2 illustrates cross-sectional views of transistors having gate noble metal nanoparticles in accordance with a number of embodiments of the present disclosure.

The physical size of memory devices is getting smaller. Memory devices can include memory cells including a transistor and a storage element, e.g., a 1T1C (one transistor one capacitor) memory cell. The memory cells can be on pitch with other components of a memory devices such as sensing circuitry (e.g., sense amplifiers) and sub wordline drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). The halo margin may be worsened and there may be a threshold voltage (Vt) mismatch between adjacent transistors. Increasing the space between adjacent transistors may reduce the probability of SCE but it may also limit the minimum pitch of other components of the memory device. In some previous approaches, a trench (e.g., a recessed channel) may be formed between adjacent transistors to overcome the SCE. However, decreasing the pitch between transistors may also increases the probability of capacitive coupling (disturbs) of adjacent transistors. A trench may not impede, and may even increase, the capacitive coupling of adjacent transistors.

Pure semiconductors don't conduct electric current. Doping a semiconductor changes the electrical characteristics of the semiconductor and allow it to conduct electricity. Adding impurities to the semiconductor is known as doping. The atoms of a pure semiconductor are held together by strong covalent bonds. Doping a pure semiconductor material upsets its bonds and frees electrons. Freeing the electrons makes the semiconductor more conductive. Doped semiconductors can become n-type semiconductors or p-type semiconductors. In n-type semiconductors, negatively charged electrons are the majority carriers and positively charged holes are the minority carriers. In p-type semiconductors, positively charged holes are the majority carriers and negatively charged electrons are the minority carriers. In some previous approaches, semiconductors can be doped using diffusion or ion implementation.

A buried recessed access device (BRAD) may use doping to improve channel conductivity. Scaling BRADs for future generations has become increasingly challenging due to coupled tradeoff between gate induce drain leakage (GIDL) and subthreshold leakage. Methods to achieve desired threshold voltage through boron implants come with a tradeoff of higher GIDL due to higher junction electric field implant damage. The ion implant dopants may migrate within the channel as well, thus changing the device's conductive properties. Achieving uniform channel dopant concentration in thin silicon pillars by doping ultra thin pillars and activating dopants has become more challenging with scaling.

The present disclosure includes apparatuses and methods related to encapsulated nanoparticles. In contrast to some previous approaches, rather than increasing or adding dopant to a channel of the device, a threshold voltage is independently controlled electrostatically at the bottom of the channel through work function change. An example of an apparatus described herein includes, in a number of embodiments, a first source/drain region and a second source/drain region separated by a channel. A gate that includes noble metal nanoparticles opposes the channel. A source line coupled to the first source/drain region and a storage node coupled to the second source/drain region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of memory devices can refer to one or more memory devices and a number of iterations of particular elements recited in a claim can refer to performing the particular elements in one or more cycles.

The figures herein follow a numbering convention in which the first digit or digits correspond to the figure number of the drawing and the remaining digits identify an element or component in the drawing. Similar elements or components between different figures may be identified by the use of similar digits. For example, 237 may reference element "37" in FIG. 2, and a similar element may be referenced as 337 in FIG. 3.

FIG. 1 illustrates a cross-sectional view of transistors having gate noble metal nanoparticles in accordance with a number of embodiments of the present disclosure. Noble metal nanoparticles 139 may be included in a gate 101-1, . . . , 101-N (collectively referred to as gate 101) during a fabrication process. The gate 101 can also be referred to as a gate electrode. The gate 101 may be a gate to a recessed access device, e.g., a buried recessed access device (BRAD). In the example shown, the gate 101 may include a first portion 103 including encapsulated noble metal nanoparticles 139 and a doped and/or undoped polycrystalline structure, e.g., polysilicon 141, a second portion 106 including a metal, e.g., titanium nitride (TiN), and a third portion 136 including a doped polysilicon to form a hybrid metal gate (HMG) 101. The gate 101 may be separated from a channel 135, separating a first source/drain region 116-1 and 116-2 (collectively referred to as first source/drain region 116) and a second source/drain region 112-1 and 112-2 (collectively referred to as second source/drain region 112) by a gate dielectric 137. In the example of FIG. 1, two neighboring access devices 102 and 104 are shown sharing a second source/drain region 112 at a junction 122. The metallic material 130 may be formed in contact with the spacer material 126, the source/drain regions 112 and 116, and the junction 122. A bit line 133 may be formed in contact with the metallic material 130. A sense line may be coupled to the first source/drain region 116 and a storage node 131 may be coupled to the second source/drain region 112. An insulation material 140 (e.g., a dielectric material) can be formed on the spacer material 126 and the gate mask material 138, and in contact with the metallic material 130. In at least one embodiment, a first portion 128 of the metallic material 130 can be formed in contact with the spacer material 126, the source/drain regions 112 and 116, and the junction 122. Then, the insulation material 140 can be formed on the spacer material 126 and the gate mask material 138, and in contact with the first portion 128 of the metallic material 130. A second portion 134 of the metallic material 130 can then be at least partially formed on the insulation material 140 and the first portion 128 of the metallic material 130. A gate dielectric 137 may be in contact with nanoparticles 139 encapsulated in polysilicon 141 and a channel 135.

The nanoparticles 139 may be formed from noble metals. Noble metals are metals that are resistant to corrosion and oxidation in moist air. Noble metals may include, but are not limited to, ruthenium (Ru), rhodium (Rh), palladium (Pd), silver (Ag), osmium (Os), iridium (Ir), platinum (Pt), gold (Au), and molybdenum (Mo). The nanoparticles 139 may be used as a dopant to dope a material, such as polysilicon.

Doping is the intentional introduction of impurities (dopants) into a semiconductor for the purpose of modulating its electrical, optical, and structural properties. A semiconductor may be doped to be either an n-type semiconductor or a p-type semiconductor. An n-type semiconductor may be created by adding pentavalent dopants like phosphorus (P), arsenic (As), antimony (Sb), or bismuth (Bi). A p-type semiconductor may be created by adding trivalent impurities like boron (B), aluminium (Al), indium (In), and Gallium (Ga).

Using the nanoparticles 139 to dope a first gate material 141 may prevent a spread of dopant to other materials as they may be encapsulated in the first gate material 141. Other methods of doping a material, such as doping a channel region 135, may result in diffusion and the dopant spreading to other areas. Diffusion is a process in which dopants introduced into a substrate material spread into other areas. Since in diffusion, a dopant may spread to other areas, the dopant may change the conductive properties in a manner that was not intended. Doping nanoparticles 139 into an electrically isolated gate may avoid this issue. In one example, noble metal nanoparticles 139 are encapsulated in polysilicon 141. This may keep the dopant where it is intended to be and not spread to other areas.

By using the noble metal nanoparticles 139 to dope a first gate material 141, the work function of the first gate material 141 may be changed. The work function of a metal is the minimum amount of energy needed to eject an electron from the surface of a metal. Adjusting the work function of a metal may increase the effectiveness of a voltage used to conduct electrons between the n-channels and p-channels in transistors. This may alleviate the issue of GIDL since increasing the work function will decrease the chance of voltage moving through the channel and activating a switch without voltage being purposefully supplied to the transistor.

Using the nanoparticles 139 to dope a first gate material 141 may also affect the channel 135. The channel 135 may be doped with a material, such as boron. By using the nanoparticles 139, less boron may be used to dope the channel 135. This may also decrease GIDL since using less boron in the channel 135 may result in less of that boron spreading to other areas.

Figure 2:
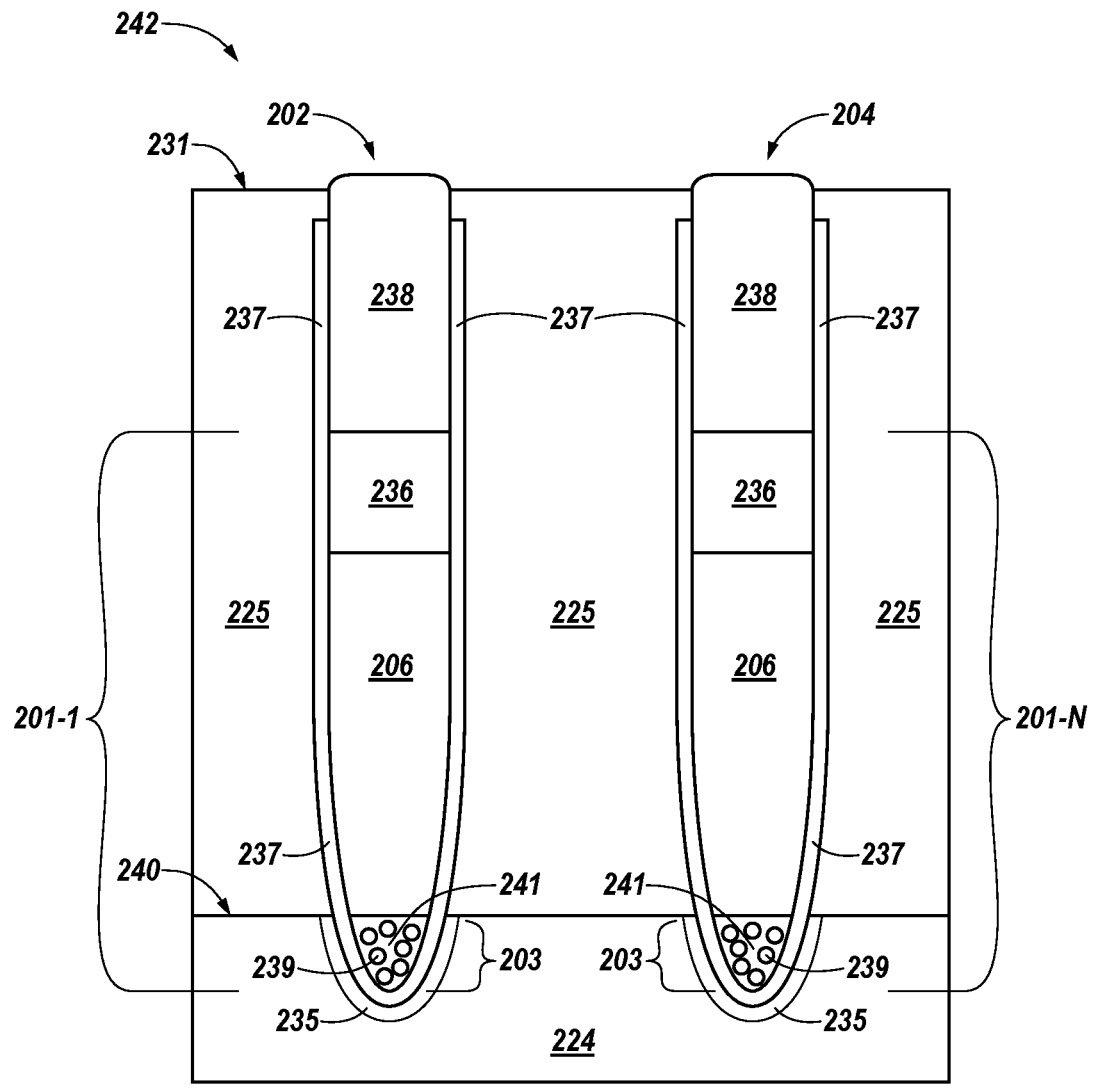

FIG. 2 illustrates a cross-sectional view of transistors having gate noble metal nanoparticles in accordance with a number of embodiments of the present disclosure. FIG. 2 illustrates a pair of transistors 202 and 204 comprising a first gate material 241, a second gate material 206, a third gate material 236, a gate mask 238, a gate dielectric 237, gate noble metal nanoparticles 239 and a channel 235.

A gate 201-1, . . . , 201-N (collectively referred to as gate 201) may be formed from multiple distinct materials. For example, the gate may be formed from nanoparticles 239, a first gate material 241, a second gate material 206, a third gate material 236 to form a hybrid metal gate (HMG) 201. In an example embodiment, the first gate material 241 can include doped and/or undoped polysilicon encapsulating noble metal nanoparticles 239. A gate dielectric 237 may separate the gate 201, e.g. HMG, including a first portion 203, a second portion 206, and a third portion 236 from a channel region 235. A hard cap material 238 can be formed on the gate 201. A working surface 240 of a semiconductor structure may be formed. Additional semiconductor material 225 may be formed on the working surface 240 to form a higher working surface 231. The first gate material 241 with the gate noble metal nanoparticles 239 may have a work function in the range of 5.0 Joules (J) to 5.4 J, the second gate material 206 may have a work function in the range of 4.5 J to 5.0 J, and a third gate material 238 may have a work function in the range of 4.0 J to 4.5 J.

The gate noble metal nanoparticles 239 may also allow for a tunable threshold voltage. A threshold voltage is the minimum gate-to-source voltage needed to create a conducting path between the source and drain terminals. Increasing the threshold voltage may decrease GIDL. GIDL is an undesirable short-channel effect that occurs at higher drain biases in an overdriven state of a transistor. The depletion region causes band bending which in-turn allows conductive band-to-band tunneling that creates excess current. GIDL can be detrimental to integrated circuits, specifically non-volatile memory circuits such as flash EEPROMs.

FIGS. 3A-3D illustrate cross-sectional views of gate noble metal nanoparticles at particular points in an example fabrication process in accordance with a number of embodiments of the present disclosure. The fabrication process illustrated in FIGS. 3A-3D is shown at particular points that correspond to particular processing activities being performed in the fabrication process; however, other processing activities included in various embodiments may be omitted for simplicity.

FIG. 3A illustrates forming an opening 348 in a semiconductor substrate 324 at a point in time 344. In one example embodiment, the opening 348 is patterned to form a recessed access devices, e.g., a buried recessed access device (BRAD). The gate dielectric 327 may be deposited in an opening 348. The gate dielectric 327 may be deposited to separate a gate, e.g., gate 101 shown in FIG. 1, from a channel region, e.g., channel region 135 shown in FIG. 1, in a semiconductor substrate 324. As shown in FIG. 3A, a first portion of a first gate material 341 may be deposited over the gate dielectric 327 over a working surface 340 of the semiconductor substrate 324 and within the opening 348. The gate dielectric 327 may be silicon dioxide. The first gate material 341 may be undoped polysilicon.

As shown in FIG. 3A, a gate dielectric 327 has been deposited across a higher working surface 331 and within the opening 348 of the semiconductor substrate 324. In one example embodiment, the gate dielectric may be conformally deposited in a semiconductor processing chamber (shown in FIG. 6). In one example embodiment the gate dielectric 327 may be a silicon dioxide (SiO2) gate dielectric. Embodiments, however, are not limited to this example.

Figure 6:
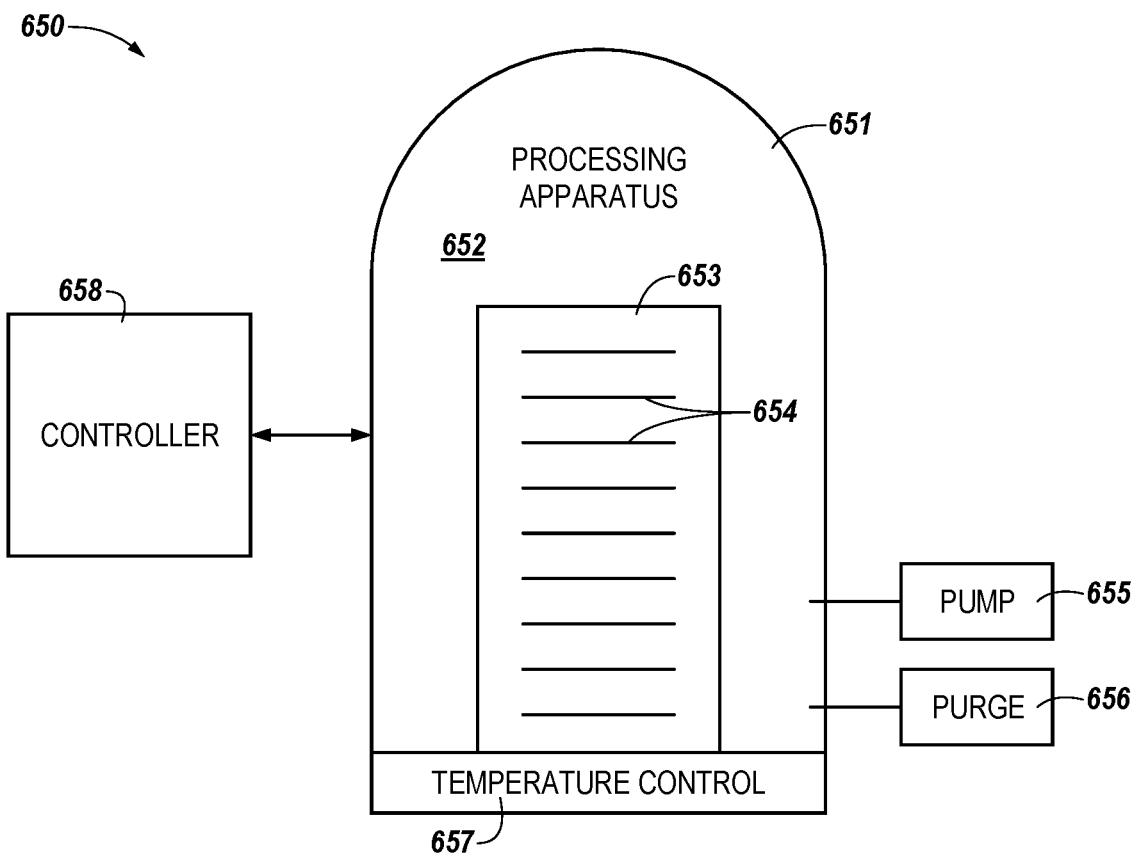
FIG. 6 is a functional block diagram of a system for implementation of an example semiconductor fabrication process in accordance with a number of embodiments of the present disclosure.

FIG. 3B illustrates a deposition of gate noble metal nanoparticles 339 at a point in time 350. The gate noble metal nanoparticles 339 can be deposited on the first gate material 341 using a variety of processes, such as chemical vapor deposition (CVD), atomic layer deposition (ALD), or other suitable fabrication processing technique. Chemical vapor deposition is a process in which a chemical that contains atoms of the material to be deposited reacts with another chemical, liberating the desired material, which deposits on the wafer while by-products of the reaction are removed from the reaction chamber; e.g., processing apparatus, as shown in FIG. 6. ALD is a subclass of CVD. Ion implementation is the introduction of selected impurities by means of high-voltage ion bombardment to achieve desired electronic properties in defined areas.

Figure 3D:
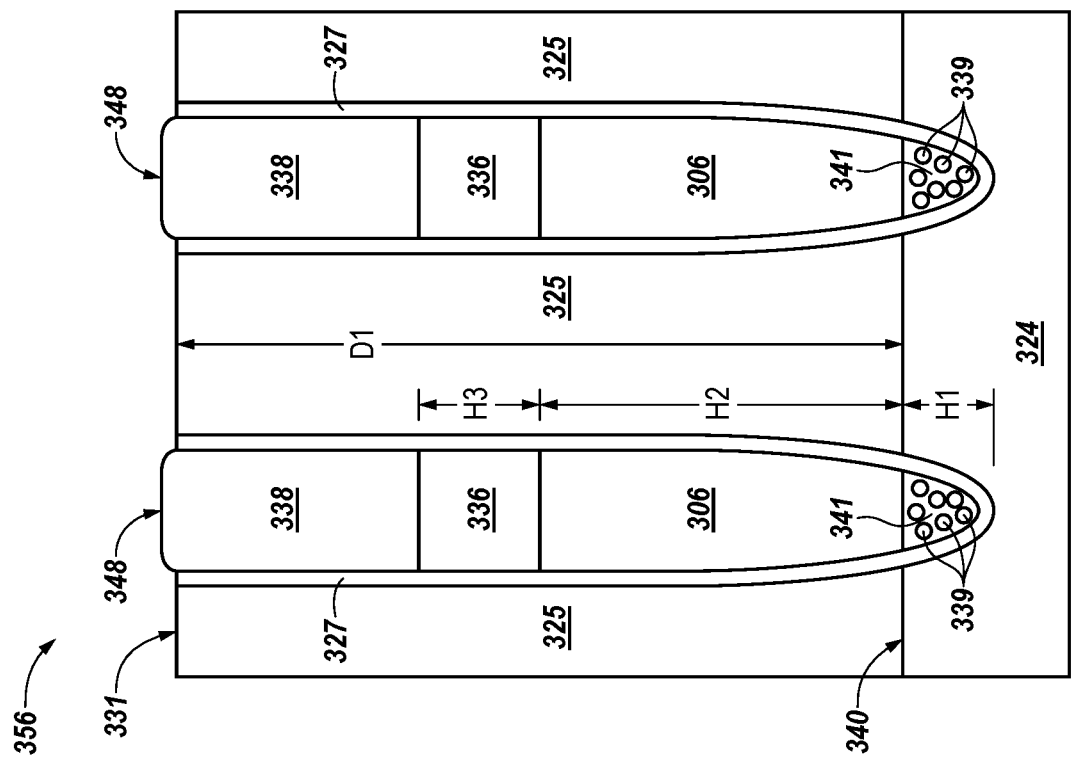
Figure 3C:
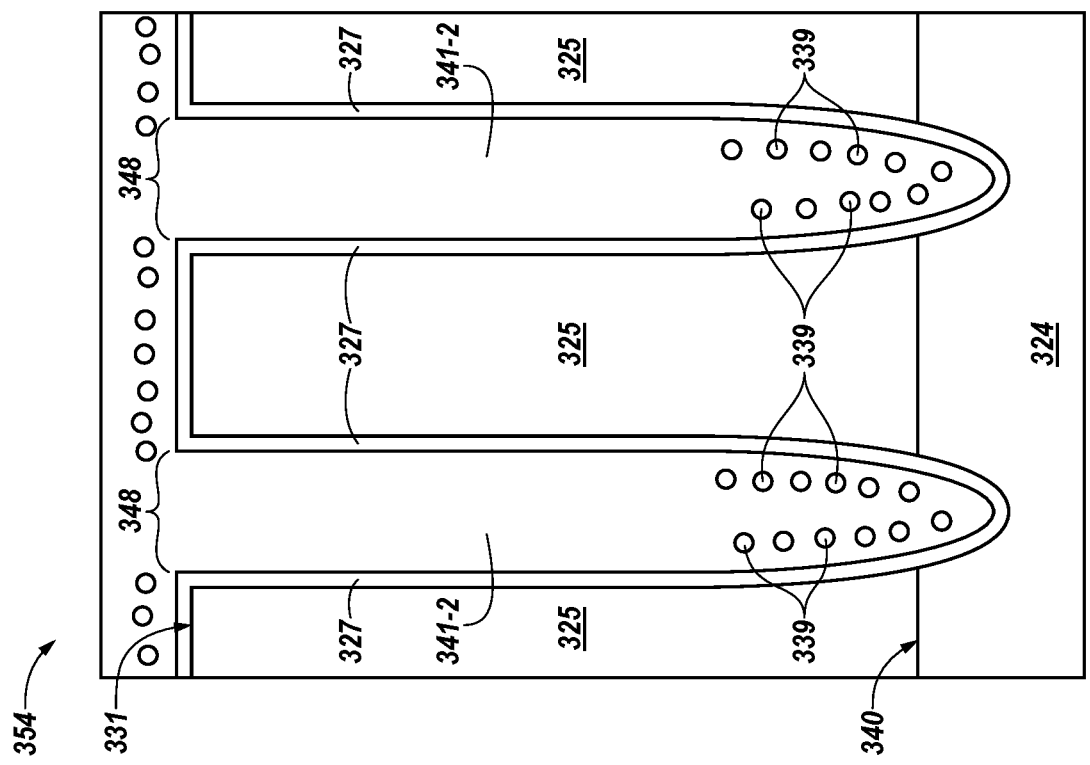

FIG. 3C illustrates a deposition of a second portion of the first gate material 341-2, over a first portion of a first gate material, e.g., the first portion of a first gate material 341-1 as illustrated in FIG. 3B, (collectively referred to herein as first gate material 341) at a point in time 354. The second portion of the first gate material 341-2 may be deposited over the gate noble metal nanoparticles 339 and encapsulate them. Hence, the encapsulated gate noble metal nanoparticles 339 are encapsulated, e.g., isolated, in the first gate material 341 within the opening 348 and separated from a channel region, e.g., channel region 135 shown in FIG. 1, by gate dielectric 327.

FIG. 3D illustrates an example structure after a next sequence of processing steps at point in time 356. In FIG. 3D, a portion of the first gate material 341 has been removed to a depth (D1) within the opening 346. A height (H1) of the remaining first gate material 341 may be a height (H1) suited to a particular design specification or to be approximately even with an original working surface 340 of the substrate 324. Embodiments, however, are not so limited. In one embodiment, the first gate material 341 may be removed using an etch process such as a selective wet etch, selective dry etch, etc. The first gate material 341 may be removed to a specific depth (D1) within the opening 348. The depth (D1) in the opening to which the first gate material 341 is removed may be sufficient to leave a remaining height H1 to the first gate material 341 in the range of 5-30 nm for a structure having an aspect ratio ("height/width") of approximately 10:1 or greater. Removing the excess first gate material 341 and gate noble metal nanoparticles 339 may leave enough space in the opening 348 to deposit other materials.

As shown in the example of FIG. 3D, a second gate material 306 may be deposited on the remaining first gate material 341 within the opening 348. In one embodiment, the second gate material 306 may be deposited on the first gate material 341 within the opening to a height (H2) of approximately 133-143 nm. In one example, the second gate material 306 may be titanium nitride (TiN).

As shown in the example of FIG. 3D, a third gate material 336 may be deposited on the second gate material 306 within the opening 348. In one embodiment, the third gate material 336 may be deposited on the second gate material 306 within the opening to a height (H3) of approximately 73-83 nm. In one example, the third gate material 336 may be polysilicon heavily doped with n-type (n$^+$) dopant. Embodiments, however, are not limited to this example.

Figure 4:
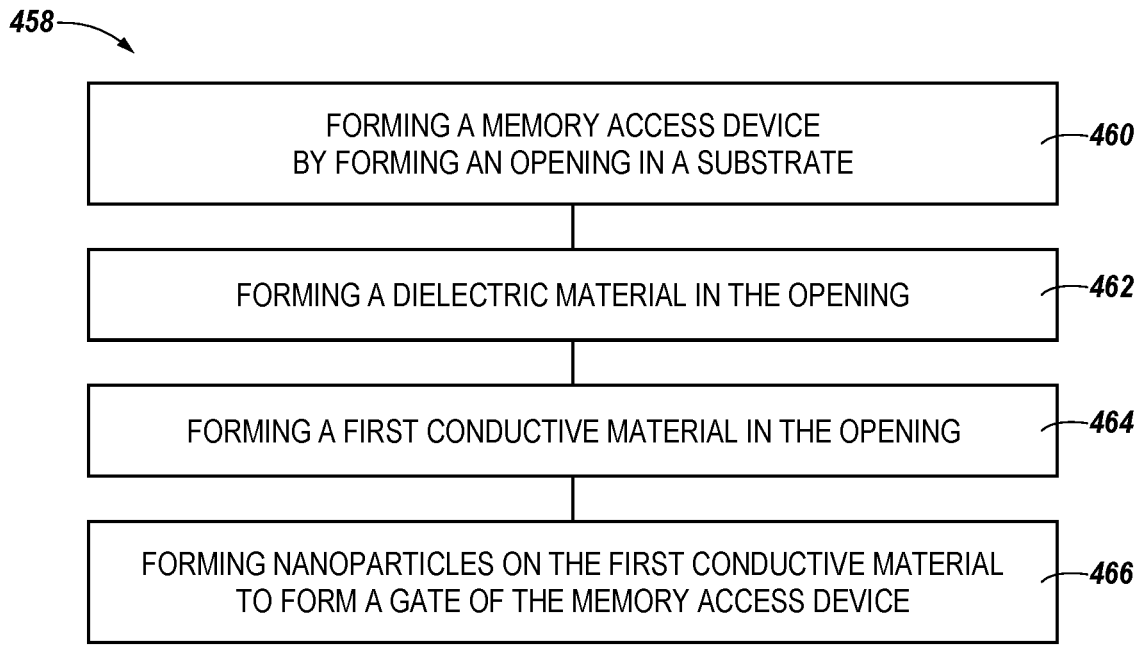
FIGS. 4-5 are flow diagrams of example methods for fabricating transistors having gate noble metal nanoparticles in accordance with a number of embodiments of the present disclosure.

FIG. 4 is a flow diagram of an example method 458 for fabricating gate noble metal nanoparticles in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 460, the method 458 may include forming a memory access device by forming an opening in a working surface of a substrate, e.g., 331 in FIG. 3A-3D. The working surface may include an original surface to a semiconductor substrate with other working layers, e.g., 325 in FIGS. 3A-3D, formed thereon. At block, 462, the method 458 may include forming a dielectric material in the opening. At block 464, the method 458 may include forming a first gate material in the opening. The first conductive material may be polysilicon.

At block 466, the method 458 may include forming nanoparticles on the first gate material to form a gate of the memory access device. The nanoparticles may be formed using chemical vapor deposition or ion implementation. Forming the nanoparticles in the gate material may dope the gate material. After being doped, the gate material may now have conductive properties.

Figure 5:
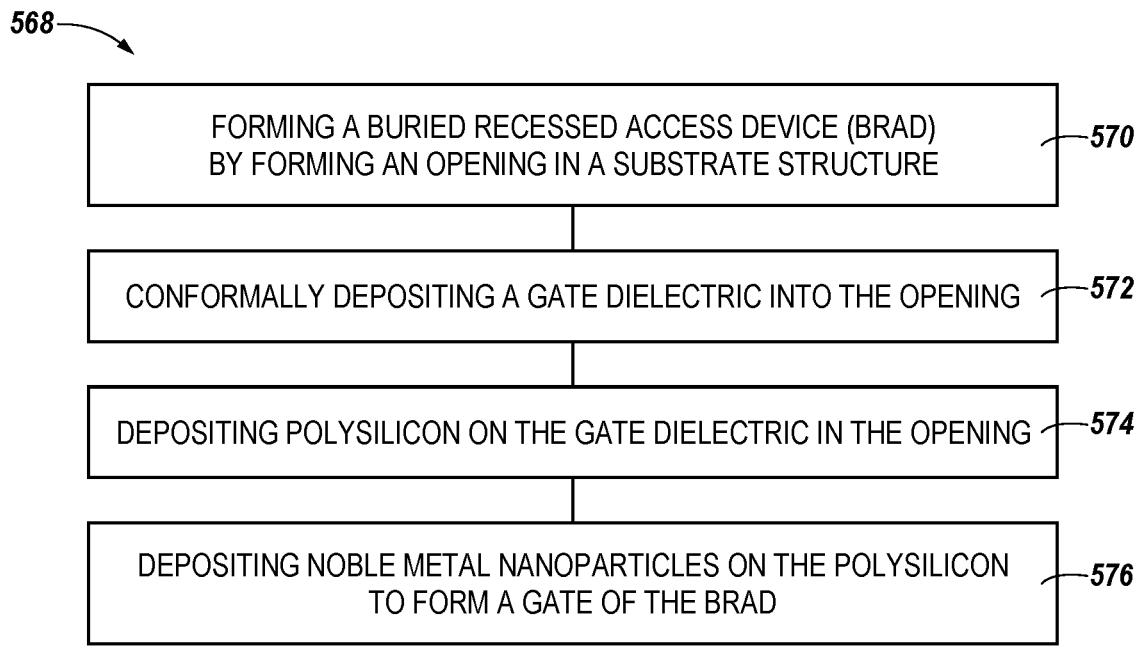

FIG. 5 is a flow diagram of an example method 568 for fabricating transistors having gate noble metal nanoparticles in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 570, the method 568 may include forming a buried recessed access device (BRAD) by forming an opening in a substrate structure. The BRAD may be included in a DRAM array. At block 572, the method 568 may include conformally depositing a gate dielectric into the opening. At block 574, the method 568 may include depositing polysilicon on the gate dielectric in the opening.

At block 576, the method 568 may include depositing noble metal nanoparticles on the polysilicon to form a gate of the BRAD. Polysilicon may be deposited over the gate noble metal nanoparticles to encapsulate the gate noble metal nanoparticles. The gate noble metal nanoparticles may dope the polysilicon. After encapsulating the gate noble metal nanoparticles, the polysilicon may be etched down to a certain height. Etching the polysilicon may create space in the opening for more materials to be deposited in the opening.

FIG. 6 is a functional block diagram of a system 650 for implementation of an example semiconductor fabrication process in accordance with a number of embodiments of the present disclosure. The numbering convention used in connection with FIG. 6 does not follow the earlier introduced numbering convention and sequence that applies to FIGS. 1-5. The system 650 may include a processing apparatus 651. The processing apparatus 651 may be configured to enable formation of structural materials on and/or removal of structural materials from a semiconductor device during fabrication of the semiconductor device.

FIG. 6 illustrates an example processing apparatus 651 that can be used in a semiconductor fabrication process. The processing apparatus 651 may include a chamber 652 to enclose components configured to perform deposition and/or etch operations on a number of semiconductor devices. The chamber 652 may further enclose a carrier 653 to hold a batch of semiconductor wafers 654. The processing apparatus 651 may include and/or be associated with tools including, for example, a pump 655 unit and a purge 656 unit configured to introduce and remove appropriate etch chemistries, as described herein, at each point in the semiconductor fabrication sequence. The processing apparatus 651 may further include a temperature control 657 unit configured to maintain the chamber 652 at an appropriate temperature at each of the points in the fabrication sequence 431. The system 650 may include a number of chambers 652 that are each configured to perform particular processes (e.g., a wet etch process, a dry etch process, and/or a deposition process, among others) during the fabrication sequence.

The system 650 may further include a controller 658. The controller 658 may include, or be associated with, circuitry and/or programming for implementation of, for instance, deposition and removal of passivation material for pillars adjacent a trench, along with etching of substrate material. Adjustment of such deposition, removal, and etching operations by the controller 658 may control the critical dimensions (CDs) of the semiconductor devices created in the processing apparatus 651.

A host may be configured to generate instructions related to protection of a top region of a pillar and an adjacent trench during removal of a substrate material at a bottom region of a trench of the semiconductor device. An example of a host is shown at 758 in FIG. 7, although embodiments are not limited to being coupled to the memory system 762 shown in FIG. 7. The instructions may be sent via a host interface 760 to the controller 658 of the processing apparatus 651. The instructions may be based at least in part on scaled preferences (e.g., in numerically and/or structurally defined gradients) stored by the host 602, provided via input from another storage system (not shown), and/or provided via input from a user (e.g., a human operator), among other possibilities. The controller 658 may be configured to enable input of the instructions and scaled preferences to define the CDs of the fabrication of the semiconductor device to be implemented by the processing apparatus 651.

The scaled preferences may determine final structures (e.g., the CDs) of the top region of the pillar, a sidewall of the pillar, a width of the pillar, a width of the trench, and/or a depth of the trench. Particular CDs may be enabled by the particular scaled preferences that are input via the instructions. Receipt and implementation of the scaled preferences by the controller 658 may result in corresponding adjustment, by the processing apparatus 651, of a deposition time for the passivation material, adjustment of a coverage area, height, and/or volume of the passivation material, adjustment of a trim direction and/or trim time performed on the passivation material, and/or adjustment of punch etch direction and/or punch etch time performed on the substrate material, among implementation of other possible scaled preferences.

The controller 658 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent a trench, along with formation of passivation material on and removal of the passivation material from the pillar and the trench.

The controller 658 may be configured to receive the instructions and direct performance of operations to perform semiconductor fabrication methods as described in connection with FIGS. 3A-3D.

Figure 7:
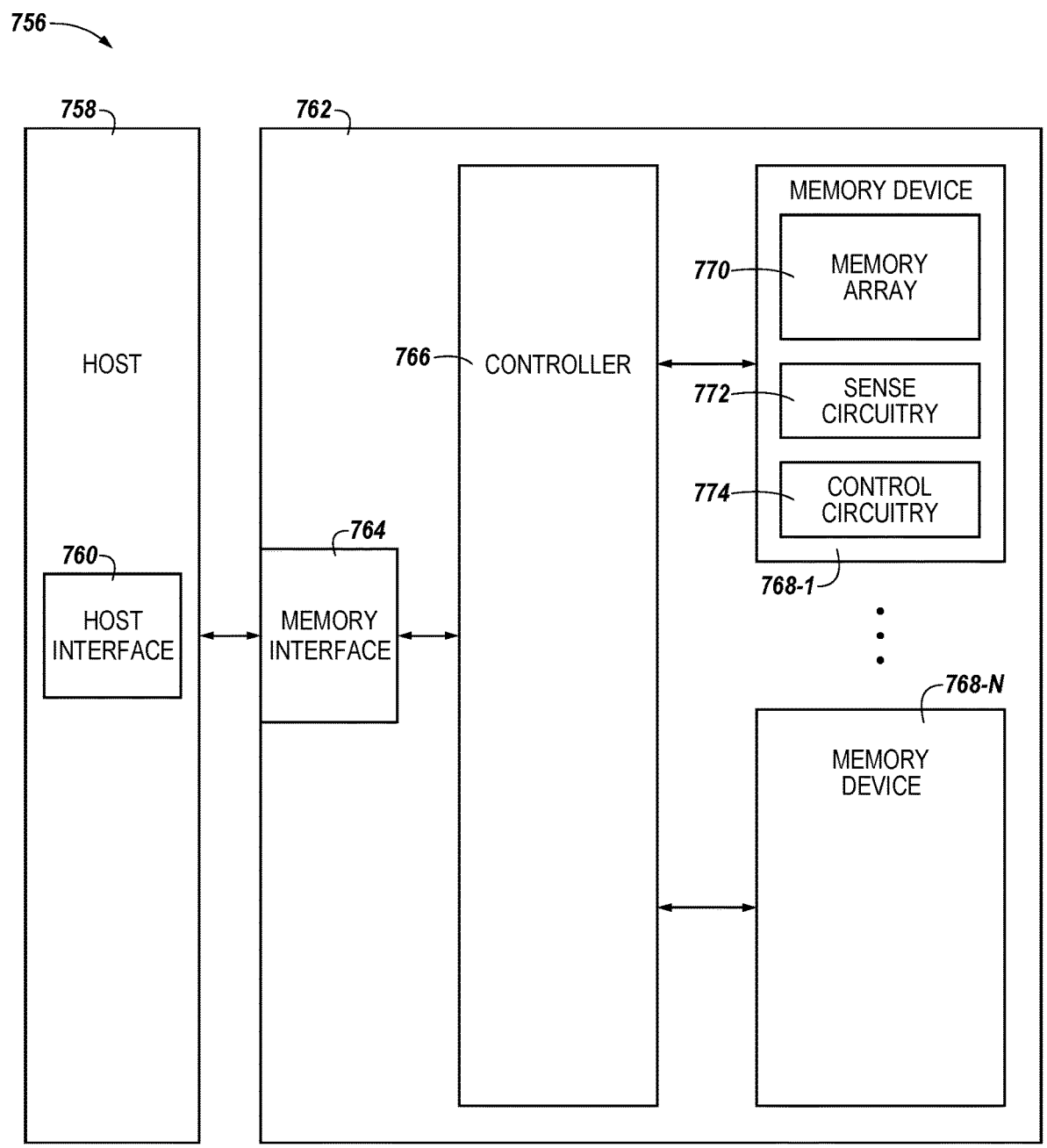
FIG. 7 is a functional block diagram of a computing system including at least one memory array having transistors in accordance with a number of embodiments of the present disclosure.

FIG. 7 is a functional block diagram of a computing system 756 including at least one memory system 762 in accordance with one or more embodiments of the present disclosure. The numbering convention used in connection with FIG. 7 does not follow the earlier introduced numbering convention and sequence that applies to FIGS. 1-5. Memory system 762 may be, for example, a solid-state drive (SSD).

In the embodiment illustrated in FIG. 7, memory system 762 includes a memory interface 764, a number of memory devices 768-1, . . . , 768-N, and a controller 766 selectably coupled to the memory interface 764 and memory devices 768-1, . . . , 768-N. Memory interface 764 may be used to communicate information between memory system 762 and another device, such as a host 758. Host 758 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 758 may be associated with fabrication operations performed on semiconductor devices and/or SSDs using, for example, a processing apparatus shown at 651 and described in connection with FIG. 6.

In a number of embodiments, host 758 may be associated with (e.g., include or be coupled to) a host interface 760. The host interface 760 may enable input of scaled preferences (e.g., in numerically and/or structurally defined gradients) to define, for example, critical dimensions (CDs) of a final structure or intermediary structures of a memory device (e.g., as shown at 768) and/or an array of memory cells (e.g., as shown at 770) formed thereon to be implemented by the processing apparatus 651. The scaled preferences may be provided to the host interface 760 via input of a number of preferences stored by the host 758, input of preferences from another storage system (not shown), and/or input of preferences by a user (e.g., a human operator).

Memory interface 764 may be in the form of a standardized physical interface. For example, when memory system 762 is used for information (e.g., data) storage in computing system 756, memory interface 764 may be a serial advanced technology attachment (SATA) interface, a peripheral component interconnect express (PCIe) interface, or a universal serial bus (USB) interface, among other physical connectors and/or interfaces. In general, however, memory interface 764 may provide an interface for passing control, address, information, scaled preferences, and/or other signals between the controller 766 of memory system 762 and a host 758 (e.g., via host interface 760).

Controller 766 may include, for example, firmware and/or control circuitry (e.g., hardware). Controller 766 may be operably coupled to and/or included on the same physical device (e.g., a die) as one or more of the memory devices 768-1, . . . , 768-N. For example, controller 766 may be, or may include, an ASIC as hardware operably coupled to circuitry (e.g., a printed circuit board) including memory interface 764 and memory devices 768-1, . . . , 768-N. Alternatively, controller 766 may be included on a separate physical device that is communicatively coupled to the physical device (e.g., the die) that includes one or more of the memory devices 768-1, . . . , 768-N.

Controller 766 may communicate with memory devices 768-1, . . . , 768-N to direct operations to sense (e.g., read), program (e.g., write), and/or erase information, among other functions and/or operations for management of memory cells. Controller 766 may have circuitry that may include a number of integrated circuits and/or discrete components. In a number of embodiments, the circuitry in controller 766 may include control circuitry for controlling access across memory devices 768-1, . . . , 768-N and/or circuitry for providing a translation layer between host 758 and memory system 762.

Memory devices 768-1, . . . , 768-N may include, for example, a number of memory arrays 770 (e.g., arrays of volatile and/or non-volatile memory cells). For instance, memory devices 768-1, . . . , 768-N may include arrays of memory cells, such as a portion of an example memory device 776 structured to include sense line contacts. At least one array includes a transistor having a gate structure formed according to the embodiments disclosed herein. As will be appreciated, the memory cells in the memory arrays 770 of memory devices 768-1, . . . , 768-N and/or as shown at 776 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 768, 776 may be formed on the same die. A memory device (e.g., memory device 768-1) may include one or more arrays 770 of memory cells formed on the die. A memory device may include sense circuitry 772 and control circuitry 774 associated with one or more arrays 770 formed on the die, or portions thereof. The sense circuitry 772 may be utilized to determine (sense) a particular data value (e.g., 0 or 1) that is stored at a particular memory cell in a row of an array 770. The control circuitry 774 may be utilized to direct the sense circuitry 772 to sense particular data values, in addition to directing storage, erasure, etc., of data values in response to a command from host 758 and/or host interface 760. The command may be sent directly to the control circuitry 774 via the memory interface 764 or to the control circuitry 774 via the controller 766.

The embodiment illustrated in FIG. 7 may include additional circuitry that is not illustrated so as not to obscure embodiments of the present disclosure. For example, memory devices 768, 776 may include address circuitry to latch address signals provided over I/O connectors through I/O circuitry. Address signals may be received and decoded by a row decoder and a column decoder to access a memory array 770. It will be appreciated that the number of address input connectors may depend on the density and/or architecture of memory devices 768, 776 and/or memory arrays 770.

Figure 8:
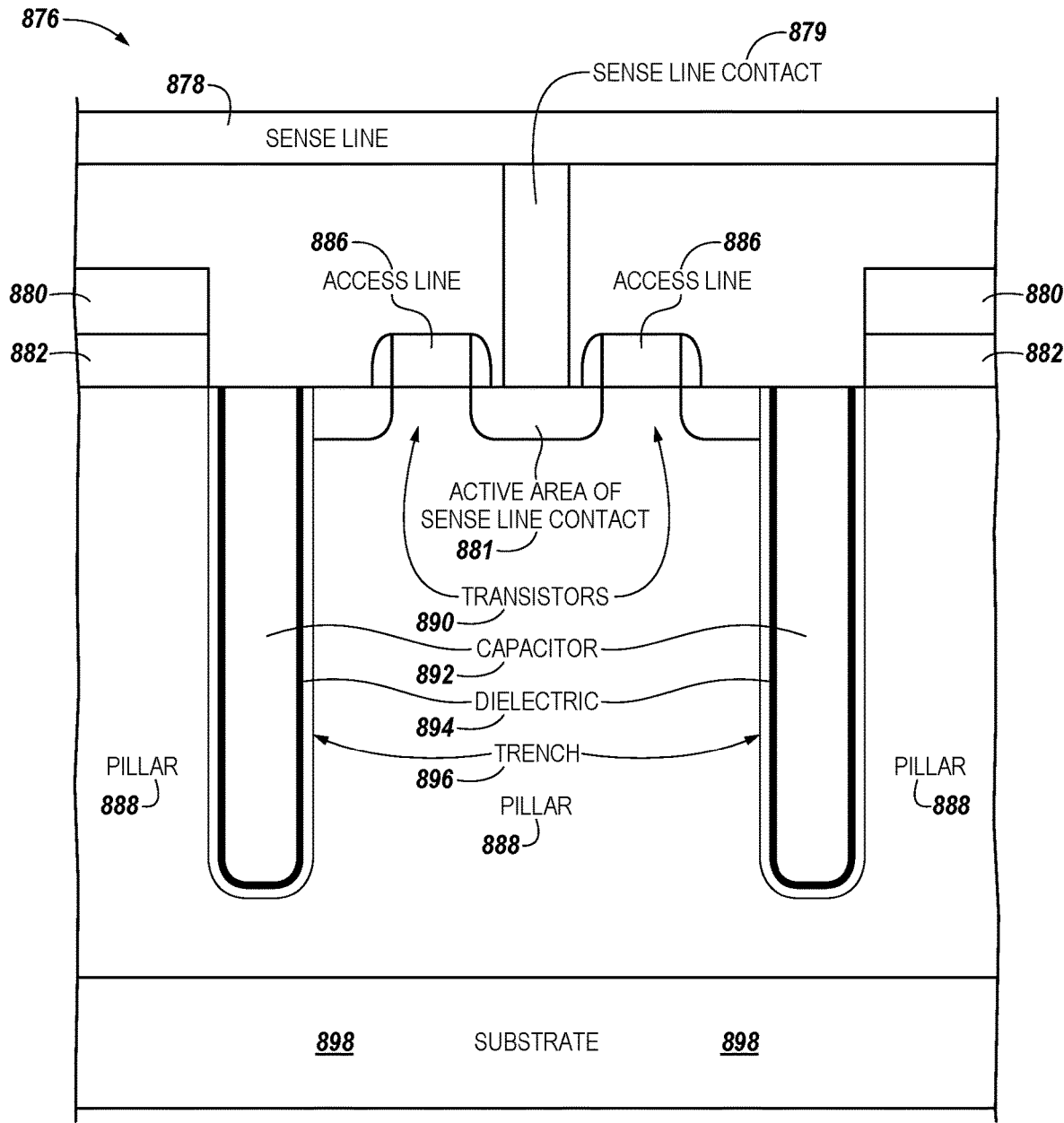
FIG. 8 illustrates a cross-sectional view of a portion of example semiconductor structures of a memory device that include transistors formed in accordance with a number of embodiments of the present disclosure.

FIG. 8 illustrates a cross-sectional view of a portion of an example of semiconductor structures of a memory device 876 that include sense line contacts to sense lines formed in accordance with a number of embodiments of the present disclosure. The numbering convention used in connection with FIG. 8 does not follow the earlier introduced numbering convention and sequence that applies to FIGS. 1-5. The portion of the memory device 876 illustrated in FIG. 8 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 890 and capacitors 892 are shown to be arranged in a lateral configuration, embodiments may include the transistors 890 and capacitors 892 being arranged in a lateral, a vertical, or any other configuration, e.g., may include buried recessed access devices (BRADs). According to a number of embodiments, the memory array includes at least one transistor formed according to the techniques described herein.

The portion of the memory device 876 shown in FIG. 8 may represent two DRAM memory cells in a 1T1C (one transistor one capacitor) configuration or one DRAM memory cell in a 2T2C configuration. DRAM memory cells may utilize capacitors 892 each formed in a trench 896 to store a particular charge corresponding to a data value. Forming the trenches 896 as shown in FIG. 8 may result in a pillar 888 being formed from the etched material on each side of a trench 896. Pillars 888 may be formed (e.g., fabricated) as layers of doped or undoped semiconductor material deposited on a substrate material 898. The semiconductor material may be etched to form the pillars 888 and trenches 896. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 896 may be etched to a particular depth into a pillar material. The trench 896 may be etched into the material of the pillars 888 to a depth approaching the substrate material 898, as shown in FIG. 8. The depth of the trench 896 approaching, at the top of, and/or into the substrate material 898 is termed herein as being in the bottom region of the trench 896. The trench 896 may be lined with a dielectric material 894.

As described herein, deepening (e.g., etching) the trench further into the pillar material or the substrate material, formed according to embodiments described in FIGS. 1-5, may increase a surface area of the trench boundaries. In one example, increasing the surface area of the trench boundaries may increase a capacitance of a capacitor 892 formed in the trench 896 (e.g., by increasing a volume and/or surface area of the capacitor). In this example, the trench 896 may be lined with a dielectric material 894 and a capacitor material may be formed (e.g., deposited) within the trench 896 and on the dielectric material 894 to form the capacitor 229 to a particular (e.g., target) depth.

Each pillar 888 of the pillar material may extend to a particular height (e.g., as shown at 132 and described in connection with FIG. 1) above the substrate material 898. As such, each pillar 888 has a top surface 826 at the particular height. A number of structural materials may be formed on or in association with the top surface 826 of the pillar 888 adjacent the trench 896. For example, a particular material 882 may be formed to contribute to data access, storage, and/or processing (e.g., conductor, resistor, and/or dielectric materials). Such a material 882 may be formed on the top surface 826 of the pillar 888 adjacent the trench 896. A mask material 880 may be formed to protect an underlying material 882 and/or the top surface 826 of the pillar 888 adjacent the trench 896 from subsequent processing and/or wear encountered in use of the memory device 676. Other structural materials that may be formed (e.g., in a DRAM configuration as shown in FIG. 8) on or in association with the top surface 826 of the pillar 888 adjacent the trench 896. The other structural materials may include the transistors 890, access lines 886, and/or sense lines 678, among other possible structural materials. The structural materials just described as being formed on and/or in association with the top surface 826 of the pillar 888 adjacent the trench 896 are termed herein as being in a top region of the pillar 888 and/or trench 896. According to a number of embodiments, the gate to a transistor, whether lateral or vertical, can include a gate having noble metal nanoparticles In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings, among other materials and/or components related to patterning a material over an active area for a sense line contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a material over an active area for a sense line contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. An apparatus, comprising:
   a source and a drain formed in a substrate, wherein the source and the drain are coupled by a channel;
   a gate opposing the channel, wherein the gate includes noble metal nanoparticles;
   a sense line coupled to the source via a first conductive material; and
   a storage node coupled to the drain via a second conductive material.

2. The apparatus of claim 1, wherein the noble metal nanoparticles are encapsulated in the gate.

3. The apparatus of claim 1, wherein the noble metal nanoparticles are ruthenium.

4. The apparatus of claim 1, wherein the apparatus includes a buried recessed access device (BRAD).

5. The apparatus of claim 4, wherein the BRAD is included in a dynamic random access memory (DRAM) array.

6. The apparatus of claim 1, wherein the gate comprises:
   a first gate material; and
   wherein the first gate material comprises polysilicon encapsulated noble metal nanoparticles.

7. The apparatus of claim 6, wherein:
   the gate comprises a second gate material formed of titanium nitride on the first gate material; and
   a third gate material formed of heavily doped n-type dopant ($n^+$) polysilicon on the second gate material to form a hybrid metal gate (HMG).

8. A method, comprising:
   forming a first source/drain region and a second source/drain region in a substrate, wherein the first source/drain region and the second source/drain region are separated by a gate dielectric;
   forming a gate opposing a channel, wherein the gate includes noble metal nanoparticles;
   forming a sense line coupled to the first source/drain region via a conductive material; and
   forming a storage node coupled to the second source/drain region via the conductive material.

9. The method of claim 8, further comprising depositing the noble metal nanoparticles in a polysilicon material of the gate, wherein the gate is formed in a trench formed in the substrate material.

10. The method of claim 9, further comprising depositing the polysilicon material as undoped polysilicon material.

11. The method of claim 9, further comprising depositing the polysilicon material as doped polysilicon material.

12. The method of claim 9, further comprising encapsulating the noble metal nanoparticles by:
   depositing a first portion of the polysilicon material in the trench formed in the substrate material;
   depositing the noble metal nanoparticles over the first portion of the polysilicon material; and
   depositing a second portion of the polysilicon material over the noble metal nanoparticles.

* * * * *